United States Patent [19]

Delmas et al.

[11] Patent Number: 5,663,688

[45] Date of Patent: Sep. 2, 1997

[54] METHOD OF ENHANCING THE NOISE IMMUNITY OF A PHASE-LOCKED LOOP, AND DEVICE IMPLEMENTING THIS METHOD

[75] Inventors: Christian Delmas, Saint Egreve; Francis Dell'Ova, St. Hilaire du Touvet; Frederic Paillardet, Grenoble, all of France

[73] Assignee: Thomson Multimedia S.A., Courbevoie, France

[21] Appl. No.: 553,376

[22] PCT Filed: Jun. 3, 1994

[86] PCT No.: PCT/FR94/00659

§ 371 Date: Apr. 2, 1996

§ 102(e) Date: Apr. 2, 1996

[87] PCT Pub. No.: WO94/29964

PCT Pub. Date: Dec. 22, 1994

[30] Foreign Application Priority Data

Jun. 8, 1993 [FR] France ................... 93 06836

[51] Int. Cl.[6] ................................................ H03L 7/08
[52] U.S. Cl. ........................... 331/14; 331/1 A; 331/20; 331/25; 327/156; 327/157; 327/159; 348/536; 360/51

[58] Field of Search ................ 331/1 A, 11, 14, 331/17, 20, 25, DIG. 7; 327/156–159; 348/536, 540, 542, 547; 360/51

[56] References Cited

U.S. PATENT DOCUMENTS

| 4,047,223 | 9/1977 | Hofmann ................... 348/542 |
| 4,435,657 | 3/1984 | Taguchi et al. .............. 307/516 |
| 4,872,155 | 10/1989 | Yokogawa et al. ........... 369/59 |
| 5,008,629 | 4/1991 | Ohba et al. .................. 328/14 |
| 5,019,907 | 5/1991 | Murakoshi et al. .......... 348/542 |
| 5,028,885 | 7/1991 | Voigt et al. ................... 331/1 |

FOREIGN PATENT DOCUMENTS 2067372  7/1981  United Kingdom .

*Primary Examiner*—David Mis
*Attorney, Agent, or Firm*—Joseph S. Tripoli; Frederick A. Wein; Peter M. Emanuel

[57] ABSTRACT

The present invention relates to a method of enhancing the noise Immunity of a phase-locked loop. The phase-locked loop includes a comparator and apparatus for inhibiting the action of the comparator on the phase-locked loop. According to the method, the inhibition is lifted during a main time window resulting from the intersection of a first time window derived from the input signal of the phase-locked loop, and of a second time window derived from the loop-return signal.

16 Claims, 5 Drawing Sheets

METHOD OF ENHANCING THE NOISE IMMUNITY OF A PHASE-LOCKED LOOP, AND DEVICE IMPLEMENTING THIS METHOD

BACKGROUND

The invention relates to a method of enhancing the noise immunity of a phase-locked loop used in the field of television signal processing, especially when locking onto the frequency of synchronization signals. The invention relates also to a device comprising a phase-locked loop and implementing the said method.

The invention is intended particularly for phase-locked loops produced as integrated circuits, particularly in MOS technology, more particularly CMOS technology.

A functional diagram of a conventional phase-locked loop is represented in FIG. 1. According to this specific example of the prior art, the PLL receives a reference signal consisting of synchronization pulses derived by a synchronization extractor 1 from the composite video baseband signal, CVBS.

A phase comparator 2 receives the synchronization thus extracted on one of its inputs. A filter 3, as well as a voltage-controlled oscillator (or VCO) 4 are connected in series with the phase comparator 2. The output of the VCO is looped back onto another input of the phase comparator 2. The return loop includes a frequency divider by N, referenced 5.

When the device is locked, the input signals of the phase comparator 2 are in phase, the voltage on the filter 3 does not vary and the output frequency of the VCO is constant. This frequency is equal to N times the frequency of the synchronization.

In the event of a jump in the phase of the synchronization signal coming from the extractor 1 (reference signal), the said synchronization signal and the looped-back signal are no longer in phase. The comparator then causes the voltage on the filter 3 to vary, and consequently the voltage at the input of the VCO 4. The output frequency of the latter then varies in such a way as to put the two input signals of the phase comparator 2 back in phase.

FIG. 2a shows an example of a CVBS signal, as well as two defects 6 and 7 possibly leading to erroneous synchronization pulses being obtained. Such a noisy CVBS signal is encountered in practice, for example at the output of a video recorder.

FIG. 2b represents the signal derived by the synchronization extractor 1 from the CVBS signal represented by FIG. 2a. The defect 6 creates a stray pulse 6a, while the defect 7 causes a pulse to be absent. In both cases, there is unlocking of the PLL loop.

The output frequency of the PLL loop is thus prone to variations. The latter can be troublesome particularly in the following three cases:

When the gain of the VCO 4 is high, variations in the output frequency are large even for small variations in voltage at the input of the said VCO.

When the phase comparator 3 includes a phase-frequency detector, (PFD), possessing logic outputs as described below, a small phase jump at the input can cause it to trip over. There is no gradation between the high state and the low state of the. PFD outputs. As in the case of high gain of the VCO 4, this can cause rapid variations ("jitter") of the output frequency.

When the output frequency is driving digital circuits, even slight variations in the said frequency can occasion malfunctioning.

Such defects are encountered particularly in integrated circuits, for example circuits of the CMOS type.

The purpose of the invention is to avoid the unlocking of a phase-locked loop due to a CVBS signal of mediocre quality. In consequence, one object of the invention is to enhance the noise immunity of a phase-locked loop and to minimize the rapid variations or "jitter" of the output frequency of the phase-locked loop.

The subject of the invention is a method of enhancing the noise immunity of a phase-locked loop, the said phase-locked loop comprising a comparator and means for inhibiting the action of the comparator on the said phase-locked loop, the said method being characterized in that the said inhibition is lifted in the course of a main time window resulting from the intersection of a first time window derived from the input signal of the phase-locked loop and of a second time window derived from the loop return signal.

In what follows, the term "reference signal" refers to the signal to the frequency of which it is desired to lock the PLL loop. It relates therefore to the signal sent to the comparator of the said loop.

The term "input signal" refers to the signal serving to derive the said reference signal.

According to one particular embodiment, the said reference signal comprises strobes derived, by reshaping, from pulses extracted from the said input signal.

According to one particular embodiment, the said first window is triggered by a pulse of the input signal of the phase-locked loop.

According to one particular embodiment, the first window is for the purpose of enabling the action of the comparator in the presence of a pulse in the input signal.

According to one particular embodiment, the comparator receives a reference signal comprising strobes derived from pulses extracted from the input signal.

According to one particular embodiment, the said window is physically represented by strobes derived from pulses of the input signal, the strobes of the analog window overlapping, in terms of time, the active edge of the corresponding strobes of the reference signal sent to the comparator.

According to one particular embodiment, the signal corresponding to the first window includes a strobe when a pulse of the input signal exceeds and first voltage threshold.

According to one particular embodiment, the reference signal includes a strobe when a pulse of the input signal exceeds a second voltage threshold situated between the first voltage threshold and the peak pulse voltage.

According to one particular embodiment, the said second window enables the action of the comparator only around the active edge of the loop return signal.

According to one particular embodiment, the phase-locked loop comprises a frequency divider in its return loop, the said divider comprising an N-state counter counting the output pulses of the phase-locked loop, the said divider generating the loop return signal sent to the comparator.

According to one particular embodiment, the said second window enables the action of the comparator only during the x states preceding and the y states following the transition of the divider which defines the active edge of the loop return signal.

According to one particular embodiment, the inhibiting action of the signal corresponding to the second window is implemented only when the phase-locked loop is locked.

According to one particular embodiment, the locking state is defined by a boolean variable (MUTE), set to the true state when, for n successive pulses extracted from the input signal, the corresponding active edges of the reference signal lie within the second window.

According to one particular embodiment, the said boolean variable (MUTE) is set to the false state when, for n successive pulses extracted from the input signal, the corresponding active edges of the reference signal lie within the second window.

According to one particular embodiment, the signal corresponding to the main time window results from a logic "AND" between the signal corresponding to the first window and the signal corresponding to the second window.

A further subject of the invention is a device including a phase-locked loop and implementing the method in accordance with the invention, characterized in that the said device comprises means for creating the main time window during which the comparator can act on the output frequency of the said phase-locked loop, the said comparator being a phase and/or frequency comparator the outputs of which control the transistors of a charge-pump circuit charging a loop filter, the outputs of the comparator being inactivated outside the said time window.

According to one particular embodiment of the device in accordance with the invention, the means of deriving the main time window comprise means of deriving a first time window includings slew-rate-controlled amplifier, the output of which is connected to a peak detector feeding a resistor bridge one connection of which supplies the desired percentage of the said peak value to the negative input of a comparator, the positive input of the said comparator being connected to the output of an amplifier, the output of the said comparator supplying the signal representing the said first window.

BRIEF DESCRIPTION OF THE DRAWINGS

Other advantages and characteristics of the invention will emerge through the description of a non-limiting preferred embodiment illustrated by the attached figures, among which.

DETAILED DESCRIPTION OF THE PREFERRED EMBODIMENT

According to the particular embodiment described below, the input signal is a composite video baseband signal, from which an extraction circuit extracts the synchronization pulses to the frequency of which it is desired to lock the phase-locked loop.

In what follows, the signals corresponding to the various time windows, as well as the reference signal, are logic signals, while the input signal (the CVBS signal) and the extracted synchronization are analog signals.

A phase-locked loop implementing the method for enhancing noise immunity in accordance with the invention includes a circuit 8 having the function, on the one hand, of extracting the synchronization signals from the input signal, and on the other hand, of deriving analog windows and a reference signal intended for the comparator of the PLL loop, the extracted synchronization pulses being used to derive them. The circuit 8 receives the CVBS reference signal as input. The loop equipped with the device according to the invention further includes a phase comparator 9 supplying a voltage relating to the phase and/or frequency difference in the two signals at its input.

Figure 7:
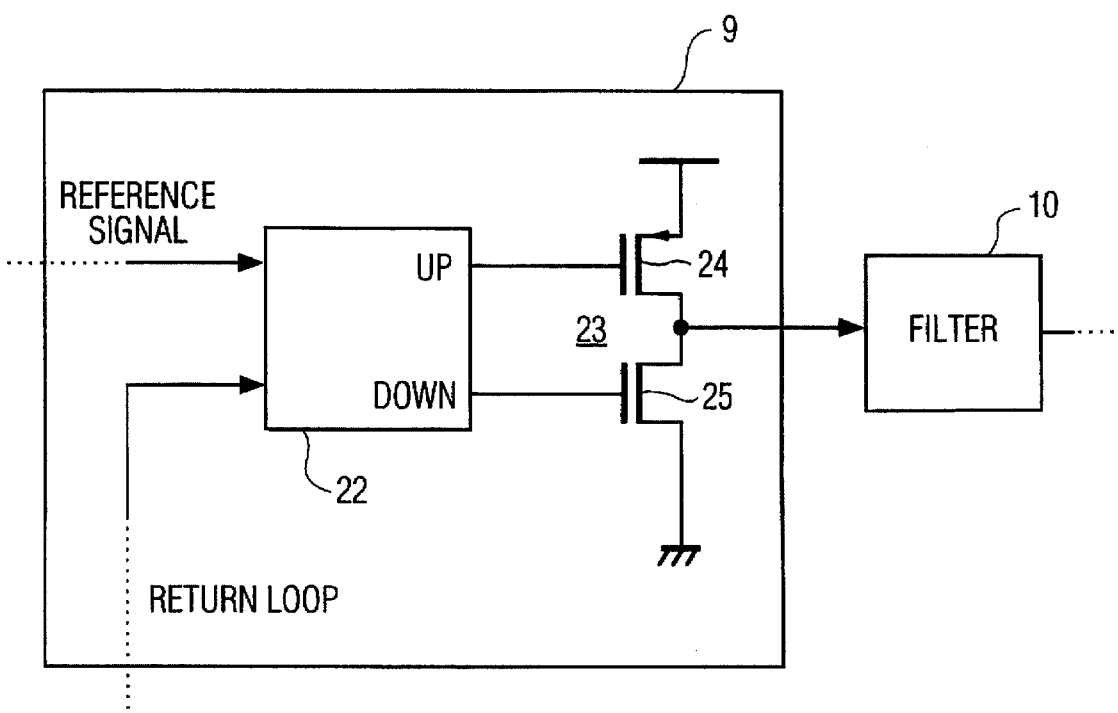
FIG. 7 represents a comparator according to the particular embodiment of the invention.

Advantageously, the phase comparator 9, represented in FIG. 7, includes a frequency-phase detector 22 followed by a charge pump 23. The comparator 9 is followed by a filter 10 and a VCO 11, the output of the latter looping back onto the input of the comparator via a divider-by-N, referenced 12.

The phase-frequency detector (PFD) 22, by comparison with a phase detector (PD), possesses a memory allowing it to compare the frequency as well as the phase. This prevents locking onto the harmonics of the frequency to be locked to. Nevertheless, according to the application, a simple phase detector, or equally a comparator of another type, may also be used.

The PFD 22 possesses two logic outputs, UP and DOWN, the high or low state of which depends on the result of the comparison between the rising edges of the reference and loop-return signals. These two outputs cannot both be active at the same time. The outputs feed a charge pump 23, the purpose of which is to convert the logic states of the outputs of the PFD 22 into analog signals suitable for control of the VCO.

The UP and DOWN outputs of the PFD 22 are connected respectively to the gate of the transistors 24 or 25 of the charge pump 23, the transistor 24 serving to charge the filter 10, the transistor 25 to discharge it. When the UP output is in the high state and the DOWN output in the low state, the charge pump is in the high-impedance state. Inverters possibly necessary for control of the transistors 24 and 25 are not represented.

The use of PFD detectors in phase-locked loops is described, for example, in the documents "Charge-Pump Phase-Lock Loops" in IEEE Transactions on Communications, Vol. Com-28, No. 11, November 1980 and "Design of PLL based clock generation circuits", IEEE Journal of Solid State circuits, Vol. SC 22, No. 2, Apr. 1987.

The filter 10 and the VCO 11 are in themselves well known to the person skilled in the art and will not be described in further detail.

The output frequency FS of the phase-locked loop is available as such, for example to serve as a clock for a digital circuit.

The operation of a phase-locked loop is known per se. However, in accordance with the invention, the comparator 9 acts on the output frequency FS only during a period of time defined by a time window. Outside of this window, the comparator does not cause the voltage on the filter 10 to vary.

According to the preferred embodiment of the invention, this time window results from the intersection of two types of windows, an analog window and a digital window.

The analog window is created by the circuit 8. Its function is to enable the phase/frequency comparison by the comparator 9 only if the input signal actually includes a synchronization pulse.

Figure 1:
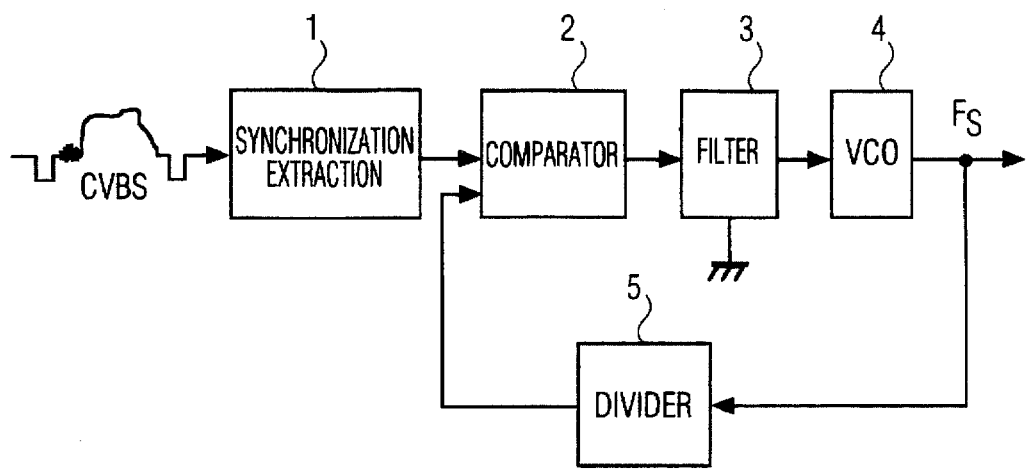
FIG. 1, already described, represents a functional diagram of a known type of phase-locked loop.
Figure 2A:
FIG. 2a representing a CVBS input signal.
Figure 2B:
FIG. 2b representing synchronization signals after extraction serving as reference signals.
Figure 3:
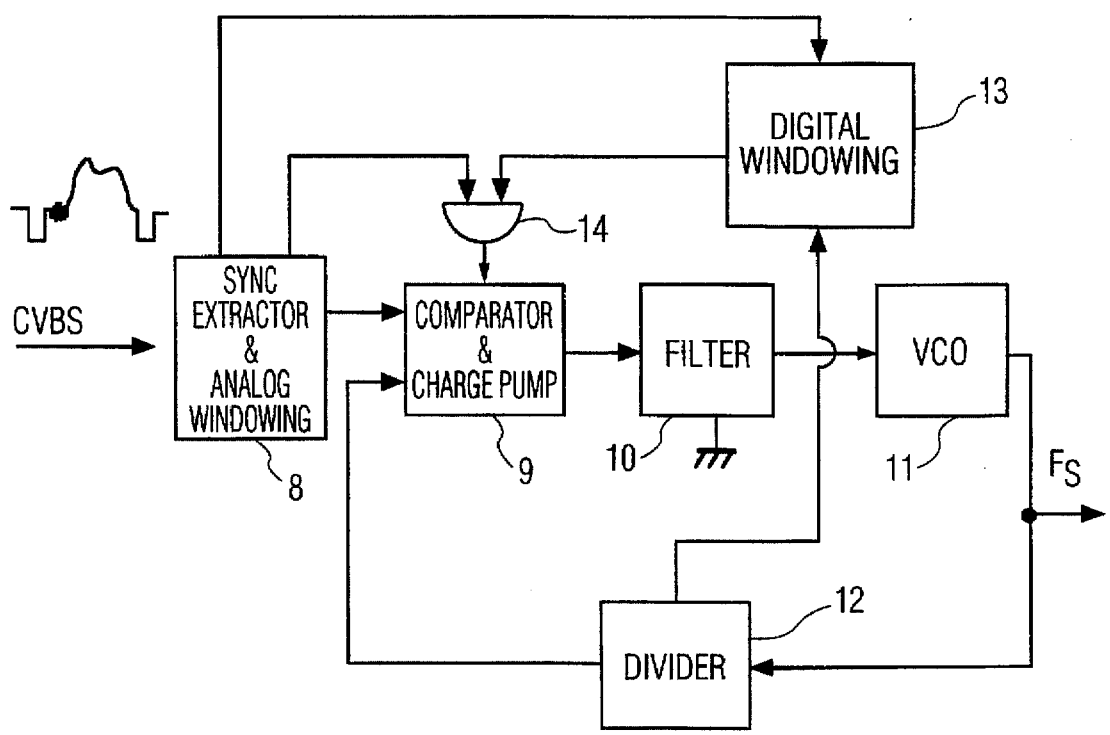
FIG. 3 represents a functional diagram of a phase-locked loop implementing the method in accordance with the invention.
Figure 4A:
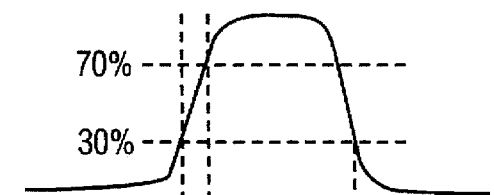
FIG. 4 illustrates the principle of generating the analog window from the synchronization pulses extracted from the input signal.
Figure 4B:
Figure 4C:
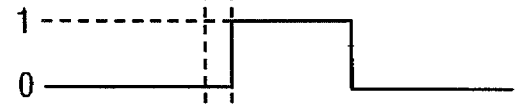

The circuit 8 comprises a synchronization extractor, deriving a signal such as the signal of FIG. 2b. From this signal, one pulse of which is represented in FIG. 4a, the circuit 8 creates the analog window represented in FIG. 4b and the corresponding strobe of the reference signal represented in FIG. 4c, the latter being sent to the comparator 9.

The analog window exists when the synchronization pulse extracted from the input signal exceeds 30% of its maximum value.

The strobe of the reference signal sent to the comparator exists when the synchronization pulse extracted from the reference signal exceeds 70% of its maximum value.

Due to the slope of the extracted pulse, the rising edge of the analog window is in advance, by ΔT, of the rising edge of the strobe sent to the comparator 9.

The time ΔT generated should allow the phase-locked loop to be locked sufficiently quickly in the case in which it is not in a stable state, which may be the case, for example, upon a change of television channel.

To do that, it is possible to act on the value of the thresholds, the values of 30% and 70% being given merely by way of example. These thresholds may also be closer together.

According to one embodiment, action is also taken on the slope of the synchronization pulses extracted from the input signal, making them pass through an amplifier the slew rate of which is chosen judiciously (filtering effect). The delay ΔT can also be generated by other means, comprising, for example, delay elements.

Figure 5:
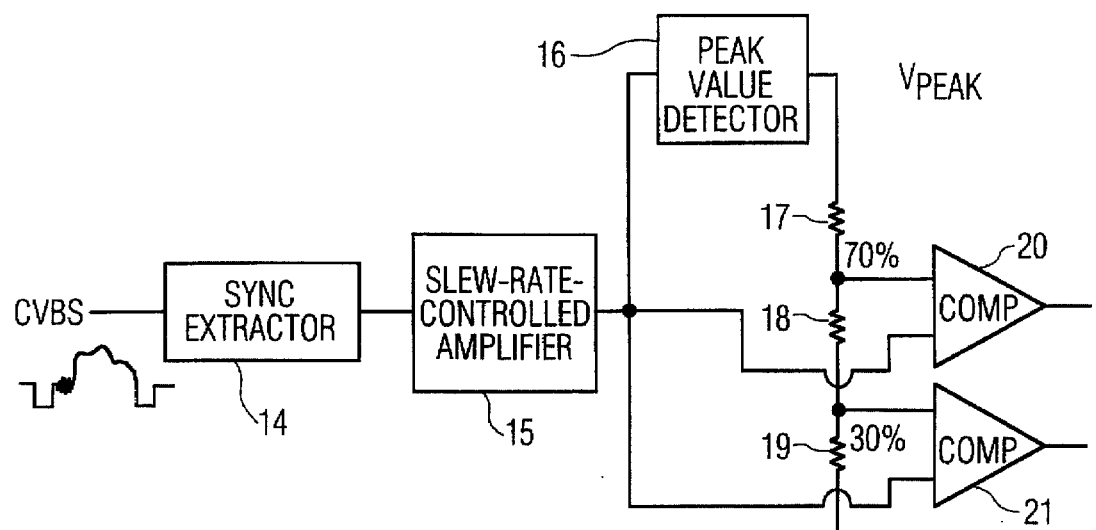
FIG. 5 represents a functional diagram of a circuit for deriving the analog window and the reference signal from synchronization pulses extracted from the input signal, FIG. 6 diagrammatically represents various signals present in a phase-locked loop equipped with a device in accordance with the invention.

FIG. 5 diagrammatically represents a circuit for deriving the analog window and pulses sent to the comparator 9.

A synchronization extractor 14 receives the clamped CVBS signal as input, and supplies an extracted (and inverted) synchronization signal to a slew-rate-controlled amplifier 15.

The amplifier 15 makes it possible to control the slope of the pulses of the extracted synchronization signal in order to obtain an acceptable ΔT.

The peak value of this signal is stored by a peak value detector 16, which supplies the said peak value as output to a resistor bridge (17, 18, 19), the values of whose resistors are chosen so as to supply the necessary threshold voltages (30% and 70% of the peak voltage value in the chosen example).

It should be noted that the stored peak value corresponds to the value of a previous pulse. It is assumed that this value does not vary in large measure between two consecutive pulses.

The threshold voltages are sent to the negative inputs of two comparators (comparator 20 for the voltage 70% and comparator 21 for the voltage at 30% of the peak voltage).

The positive input of each comparator is connected to the output of the amplifier The output of the comparator 20 thus corresponds to the synchronization pulses reshaped in order to be sent to the phase/frequency comparator 9: this is the reference signal of the phase-locked loop. The output of the comparator 21 supplies the corresponding signal to the analog window.

The digital window is derived by a circuit 13 receiving the state of the divider 12 as input, as well as the extracted synchronization pulses. It is invoked only when the loop is adequately locked.

According to the present example, the divider 12 includes a counter from 0 to N−1 which counts up the clock beats coming from the VCO 11. The return signal from the divider 12 (signal sent to the comparator) includes an active edge on each change of the counter from the N−1 state to the 0 state. This principle is diagrammatically illustrated in FIG. 8, where the active edge is a falling edge.

Figure 8:
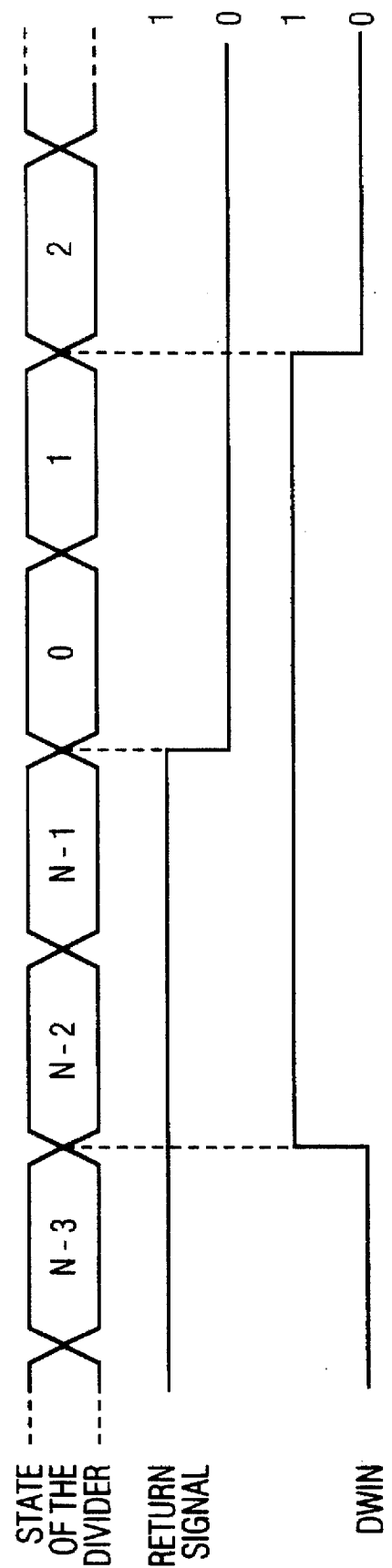
FIG. 8 represents the principle of deriving the digital window.

The circuit 13 receives the state of the counter. It derives a window signal (DWIN) which surrounds the said active edge of the return signal. In the example of FIG. 8, the width of the window DWIN is ± two clock beats around the active edge. The signal DWIN is at 1 for the states N−2, N−1, 0 and 1 of the counter of the divider 12.

The circuit 13, to this end, includes appropriate comparators the outputs of which are linked to the input of a logic OR. The output of this OR gives the signal corresponding to the digital window. Other embodiments can obviously be envisaged.

As has already been stated, the digital window is actually put into action in the control of the phase-locked loop only when this loop is locked.

According to one particular embodiment, in order to control putting the digital window into action, the circuit 13 changes the state of a control bit. This bit, called MUTE, will be set to the high state if, for n successive extracted synchronization pulses, the active edges of these pulses exist during the window DWIN. It is at this instant that the loop will be said to be locked. MUTE will be set to the low state if, for n synchronization pulses, the active edges of these synchronizations exist outside of the window DWIN: the loop will then be said not to be locked.

The signal sent to the logic "and" 14 from the circuit 13 results from a logic "and" between the signal DWIN and the state of the MUTE bit. The state of the MUTE bit thus defines a hysteresis cycle. For a given state of this bit, at least n successive pulses, either within the DWIN window, or outside according to the state of MUTE, will be required to change the said state.

This hysteresis exhibits two advantages, the first being to allow locking without upset occasioned by the digital window, the second being the maintaining of the digital window when the synchronization exhibits a slight jitter.

According to a particular embodiment, n=10.

As for the analog window, the digital window encompasses the active edge of the corresponding strobe of the reference signal sent to the comparator 9.

The signals derived by the digital windowing circuit 13 and the part of the circuit 8 concerned in the analog windowing are sent to the two inputs of a logic "and", the output of which is connected to the comparator circuit 9.

FIG. 6 gives a diagrammatic example of the various signals present in the device in accordance with the invention. In the diagram, the active edge of the synchronization pulses is the leading edge, but it is obviously possible to use the trailing edge.

The noisy input signal CVBS is similar to that of FIG. 2a.

Figure 6A:
Figure 6B:

The signal of FIG. 6b is the reference signal available at the output of the circuit 8. As before, the defect 6 causes an additional pulse to appear in the signal of FIG. 6b, whereas the defect 7 causes a pulse to be absent.

Figure 6C:

The signal represented in FIG. 6c corresponds to the analog window signal supplied by the circuit 8 to the logic "and" 14. It will be noted that this signal, on its rising edge, shows a slight advance ΔT over the rising edge of the pulses sent to the comparator 9 (FIG. 6b).

Figure 6D:
Figure 6E:

FIG. 6d shows the digital window signal sent by the circuit 13 to the logic "and" 14, while FIG. 6e shows the signal at the output of the logic "and" circuit 14: this is the time window signal.

It will be noted that the pulses of this latter signal "frame" the rising edges of the strobes of the reference signal which is sent to the comparator 9.

Comparison by the comparator 9 is enabled only in the presence of a logic 1 at the output of the circuit 14. It is only at that instant that the charge pump can function. In the opposite case, that is to say when the time window signal is at logic 0, the output of the phase-frequency detector is set to high impedance.

The analog window allows the effects of the defect 7 to be eliminated, by allowing a comparison by the comparator 9 only when a pulse is actually present in the input signal, while the digital window allows the effects of the defect 6 to be eliminated, by prohibiting a comparison at instants when a pulse should not exist. The combination of the two windows enables cancellation of the defects which the digital window would introduce if it were used alone. When a strobe is present in the digital window signal although no synchronization pulse exists in the input signal, the analog window signal is at logic zero and the comparison is not enabled.

According to one particular embodiment, only one of the analog or digital windows is used to derive the time window.

It is quite obvious that the present invention can be applied to phase-locked loops the structure of which differs from that described in the particular embodiment.

According to the embodiment example presented, the digital window is defined by the two states following and preceding the change to zero of the counter of the divider. It is clearly possible to envisag a definition by other states, particularly more than four.

We claim:

1. Method of enhancing the noise immunity of a phase-locked loop, the said phase-locked loop comprising a comparator (9) and means (14) for inhibiting the action of the comparator on the said phase-locked loop, the said method being characterized in that the said inhibition is lifted in the course of a main time window resulting from the intersection of a first time window derived from the input signal of the phase-locked loop and of a second time window derived from the loop return signal.

2. Method according to claim 1, characterized in that the said first window is triggered by a pulse of the input signal of the phase-locked loop.

3. Method according to claim 1, characterized in that the first window is for the purpose of enabling the action of the comparator (9) in the presence of a pulse in the input signal.

4. Method according to claim 1, characterized in that the comparator (9) receives a reference signal comprising strobes derived from pulses extracted from the input signal.

5. Method according to claim 4, characterized in that said window is physically represented by strobes derived from pulses of the input signal, the strobes of the analog window overlapping, in terms of time, the active edge of the corresponding strobes of the reference signal sent to the comparator (9).

6. Method according to claim 4, characterized in that the signal corresponding to the first window includes a strobe when a pulse of the input signal exceeds and first voltage threshold.

7. Method according to claim 6, characterized in that the reference signal includes a strobe when a pulse of the input signal exceeds a second voltage threshold situated between the first voltage threshold and the peak pulse voltage.

8. Method according to claim 1, characterized in that said second window enables the action of the comparator only around the active edge of the loop return signal.

9. Method according to claim 1, characterized in that the phase-locked loop comprises a frequency divider in its return loop, the said divider comprising an N-state counter counting the output pulses of the phase-locked loop, the said divider generating the loop return signal sent to the comparator (9).

10. Method according to claim 9, characterized in that the said second window enables the action of the comparator only during the x states preceding and the y states following the transition of the divider which defines the active edge of the loop return signal.

11. Method according to claim 1, characterized in that the inhibiting action of the signal corresponding to the second window is implemented only when the phase-locked loop is locked.

12. Method according to claim 11, characterized in that the locking state is defined by a boolean variable (MUTE), set to the true state when for n successive pulses extracted from the input signal, the corresponding active edges of the reference signal lie within the second window.

13. Method according to claim 12, characterized in that the said boolean variable (MUTE) is set to the false state when, for n successive pulses extracted from the input signal, the corresponding active edges of the reference signal lie within the second window.

14. Method according to claim 1, characterized in that the signal corresponding to the main time window results from a logic "AND" between the signal corresponding to the first window and the signal corresponding to the second window.

15. Device including a phase-locked loop comprising a comparator (9) and implementing the method according to claim 1, characterized in that the said device comprises means (8, 13, 14) for creating the main time window during which the comparator (9) can act on the output frequency (Fs) of the said phase-locked loop, the said comparator being a phase and/or frequency comparator (22) the outputs of which (UP, DOWN) control the transistors (24, 25) of a charge-pump circuit (23) charging a loop filter (10), the outputs of the comparator being inactivated outside the said time window.

16. Device according to claim 15, characterized in that the means of deriving the main time window comprise means of deriving a first time window including a slew-rate-controlled amplifier (15), the output of which is connected to a peak detector (16) feeding a resistor bridge (17, 18, 19) one connection of which supplies the desired percentage of the said peak value to the negative input of a comparator (21), the positive input of the said comparator (21) being connected to the output of an amplifier (15), the output of the said comparator supplying the signal representing the said first window.

* * * * *